United States Patent
Huang et al.

(10) Patent No.: US 12,062,394 B2
(45) Date of Patent: Aug. 13, 2024

(54) PERFORMING DATA INTEGRITY CHECKS TO IDENTIFY DEFECTIVE WORDLINES

(71) Applicant: Micron Technology, Inc., Boise, ID (US)

(72) Inventors: Jian Huang, Union City, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 94 days.

(21) Appl. No.: 17/546,425

(22) Filed: Dec. 9, 2021

(65) Prior Publication Data

US 2023/0186995 A1    Jun. 15, 2023

(51) Int. Cl.
| | |
|---|---|
| *G11C 16/10* | (2006.01) |
| *G11C 16/08* | (2006.01) |
| *G11C 16/26* | (2006.01) |
| *G11C 29/44* | (2006.01) |
| *G11C 29/12* | (2006.01) |

(52) U.S. Cl.
CPC ............ *G11C 16/102* (2013.01); *G11C 16/08* (2013.01); *G11C 16/26* (2013.01); *G11C 29/4401* (2013.01); *G11C 2029/1202* (2013.01)

(58) Field of Classification Search
CPC ....... G11C 16/102; G11C 16/08; G11C 16/26; G11C 2029/1202; G11C 29/4401

USPC .................................................. 365/185.24
See application file for complete search history.

(56) References Cited

U.S. PATENT DOCUMENTS

| | | | |
|---|---|---|---|
| 2013/0229868 A1* | 9/2013 | Koh ............... | G11C 16/10 |
| | | | 365/185.03 |
| 2020/0005874 A1* | 1/2020 | Shappir ........... | G11C 16/26 |
| 2020/0082890 A1* | 3/2020 | Karr ............... | G06F 3/0688 |
| 2020/0327947 A1* | 10/2020 | Park ............... | G11C 16/0483 |
| 2021/0391002 A1* | 12/2021 | Gorobets ......... | G11C 16/26 |
| 2023/0154541 A1* | 5/2023 | Yuan .............. | G11C 11/5635 |
| | | | 365/185.29 |

* cited by examiner

*Primary Examiner* — Sung Il Cho (74) *Attorney, Agent, or Firm* — Lowenstein Sandler LLP (57) ABSTRACT

Systems and methods are disclosed including a memory device and a processing device operatively coupled to the memory device. The processing device can perform operations comprising performing a write operation to program first data to a first set of memory cells addressable by a first wordline of a first plurality of wordlines of a block of the memory device; performing a read operation on a second wordline of the plurality of wordlines, wherein the second wordline is adjacent to the first wordline; determining a number of bits programmed in a first logical level in the second wordline; and responsive to determining that the number of bits set satisfies a threshold criterion, copying second data from the first block to a second block.

20 Claims, 4 Drawing Sheets

```
┌─────────────────────────────────────────────────────────┐
│ RESPONSIVE TO RECEIVING A WRITE ACCESS COMMAND, IDENTIFY │
│   A WORDLINE THAT ADDRESSES A SET OF MEMORY CELLS ONTO  │
│              WHICH TO PROGRAM THE DATA                   │
│                          210                             │
└─────────────────────────────────────────────────────────┘
                            │
                            ▼
┌─────────────────────────────────────────────────────────┐
│    PROGRAM THE RECEIVED DATA ONTO THE IDENTIFIED WORDLINE│
│                          220                             │
└─────────────────────────────────────────────────────────┘
                            │
                            ▼
┌─────────────────────────────────────────────────────────┐
│     PERFORM A DATA INTEGRITY CHECK ON THE WORDLINE       │
│         SUBSEQUENT TO THE IDENTIFIED WORDLINE            │
│                          230                             │
└─────────────────────────────────────────────────────────┘
                            │
                            ▼
                    ╱╲
                   ╱  ╲
             DATA STATE
          METRIC EXCEEDS TRANSFER ──NO──▶ END
           THRESHOLD CRITERION?
                   240
                    ╲╱
                    │
                   YES
                    ▼
┌─────────────────────────────────────────────────────────┐
│           TRIGGER MEDIA MANAGEMENT OPERATION             │
│                          250                             │
└─────────────────────────────────────────────────────────┘
                            │
                            ▼
┌─────────────────────────────────────────────────────────┐
│    RETIRE THE BLOCK ASSOCIATED WITH THE SUBSEQUENT       │
│                       WORDLINE                           │
│                          260                             │
└─────────────────────────────────────────────────────────┘
```

PERFORMING DATA INTEGRITY CHECKS TO IDENTIFY DEFECTIVE WORDLINES

TECHNICAL FIELD

Embodiments of the disclosure relate generally to memory sub-systems, and more specifically, relate to performing data integrity checks to identify defective wordlines.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to performing data integrity checks to identify defective wordlines. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can include two or more planes. For some types of non-volatile memory devices (e.g., NAND devices), each plane includes of a set of physical blocks. In some implementations, each block can include multiple sub-blocks. Each plane carries a matrix of memory cells formed onto a silicon wafer and joined by conductors referred to as wordlines and bitlines, such that a wordline joins multiple memory cells forming a row of the matric of memory cells, while a bitline joins multiple memory cells forming a column of the matric of memory cells.

Depending on the cell type, each memory cell can store one or more bits of binary information, and has various logic states that correlate to the number of bits being stored. The logic states can be represented by binary values, such as "0" and "1", or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

Precisely controlling the amount of the electric charge stored by the memory cell allows establishing multiple logical levels, thus effectively allowing a single memory cell to store multiple bits of information. A read operation can be performed by comparing the measured threshold voltage ($V_t$) exhibited by the memory cell to one or more reference voltage levels in order to distinguish between two logical levels for single-level cell (SLCs) and between multiple logical levels for multi-level cells. In various embodiments, a memory device can include multiple portions, including, e.g., one or more portions where the sub-blocks are configured as SLC memory and one or more portions where the sub-blocks are configured as multi-level cell (MLC) memory that can store three bits of information per cell and/or (triple-level cell) TLC memory that can store three bits of information per cell. The voltage levels of the memory cells in TLC memory form a set of 8 programming distributions representing the 8 different combinations of the three bits stored in each memory cell. Depending on how they are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

When data is written to a memory cell of the memory sub-system for storage, the memory cell can deteriorate. Accordingly, each memory cell of the memory sub-system can have a finite number of write operations performed on the memory cell before the memory cell is no longer able to reliably store data. Data stored at the memory cells of the memory sub-system can be read from the memory sub-system and transmitted to a host system. For example, during a read operation, a read reference voltage is applied to the wordline containing the data to be read, while a pass through voltage is applied to wordlines of unread memory cells. The pass-through voltage is a read reference voltage higher than any of the stored threshold voltages. As such, when data is written to a memory cell of the memory sub-system for storage, the memory cell can also deteriorate.

Over time, as memory access operations, including write operations, read operations, and erase operations, are repeatedly performed on the blocks of the memory device, certain defects can develop. For example, an electrical short can develop between two adjacent wordlines. When a certain voltage, such as a program voltage, for example, is applied to one of those wordlines, a current is developed, at least a portion of which can flow through the electrical short and onto the adjacent wordline. This portion of the current can be referred to as a "leakage current" and the electrical short can be referred to as a "wordline-to-wordline short." This leakage current can impact the logical values programed to or read from the memory cells connected to the associated wordlines leading to errors on the memory device. For example, a wordline-to-wordline short can cause a current (e.g., during a write operation applied to the selected wordline) to discharge some electrons to the wordline adjacent to the wordline being programmed. This results in the write operation failing to program data on the selected wordline, as well as the data on the adjacent wordline being corrupted.

Responsive to a program failure, some systems can attempt the program operation again. To recover the corrupted data, some systems can employ an error correction mechanism or a redundancy mechanism. For example, some system can implement redundant array of independent NAND (RAIN) operations to provide redundancy for the data stored on the memory sub-system. When host data is received from the host system to be programmed to a memory device of the memory sub-system, a memory sub-system controller can generate redundancy metadata based on one or more exclusive-or (XOR) operations with the received host data and can use the redundancy metadata to reconstruct or recalculate the host data in the event of a failure of a portion of the memory device that is storing host data. As an example, the memory sub-system controller can generate one or more RAIN standard codewords (redundancy metadata) based on an XOR operation applied to host data stored at a particular number of data locations of one or more logical units (LUNs) (e.g., a page, a block) of the memory sub-system. If a portion of a memory device storing the host data fails and the corresponding data is lost or corrupted, the memory sub-system controller can reconstruct the lost/corrupted data based on an XOR operation among the rest of the host data and the redundancy metadata.

However, some types of memory sub-systems do not and/or are incapable of supporting certain error correcting and redundancy mechanisms. In such systems, a wordline-to-wordline short can result in permanent data loss. Thus, mechanisms and methods for preventing data loss due to wordline-to-wordline shorts are desirable.

Aspects of the present disclosure address the above and other deficiencies by implementing a memory sub-system controller capable of performing data integrity checks to identify defective wordlines that are susceptible to wordline-to-wordline shorts. In an illustrative example, the memory sub-system controller can receive a write command and identify a wordline that addresses the set of memory cells (e.g., a page) onto which the data should be programmed. The identified wordline can be the first wordline in an empty block, or a next available wordline in a block in which one or more wordlines contain data. After the data is programmed to the identified set of memory cells, the memory sub-system controller can perform a data integrity check on a subsequent wordline of the block to determine whether any random data pattern was unintentionally programmed to the subsequent wordline during the write operation. A subsequent wordline is an adjacent wordline that is the sequentially next wordline in a block. For example, in a block of 10 wordlines, the second wordline is subsequent to the first wordline, the sixth wordline is subsequent to the fifth wordline, etc. The data integrity check can be performed on a wordline subsequent to the recently programmed wordline (rather than performed on both adjacent wordlines) when the memory sub-system controller programs data to wordlines sequentially (e.g., for a given block, first program to the first wordline of the block, then the second wordline of the block, etc.). In an example, the data integrity check can include performing a read operation on the subsequent wordline. Upon reading the data from memory cells of the subsequent wordline, the processing logic can perform a bit count operation on the read data to determine the count of bits (or memory cells) programmed to a specified logical state in the wordline (e.g., number of "0" bits programmed to the memory cells of the wordline when an erased wordline contains only "1" bits, or vice-versa). Responsive to the determined bit count exceeding a transfer threshold criterion (e.g., the bit count of the subsequent wordline is 5 which exceeds the transfer threshold criterion value of 0), the memory subsystem controller can determine that a wordline-to-wordline short occurred during the programming operation and trigger a media management operation.

The media management operation can copy the data stored on the entire block to an available block of the memory sub-system. The memory sub-system controller can then retire (remove from use) the block on which the wordline-to-wordline short occurred. Responsive to the determined bit count failing to exceed a transfer threshold criterion, the memory sub-system controller can determine that the adjacent wordlines have not deteriorated to the point where a wordline-to-wordline short will occur, and can program data to the subsequent wordline during a future write access operation.

Advantages of the present disclosure include, but are not limited to, an improved performance of the memory sub-system by reducing the number of instances where data is lost due to a wordline-to-wordline short. Since the number of instances are reduced, this can result in an improvement of performance and reliability of the memory sub-system. Although embodiments are described using wordlines of a NAND flash memory, aspects of the present disclosure can be applied to other types of memory sub-systems.

Figure 1:
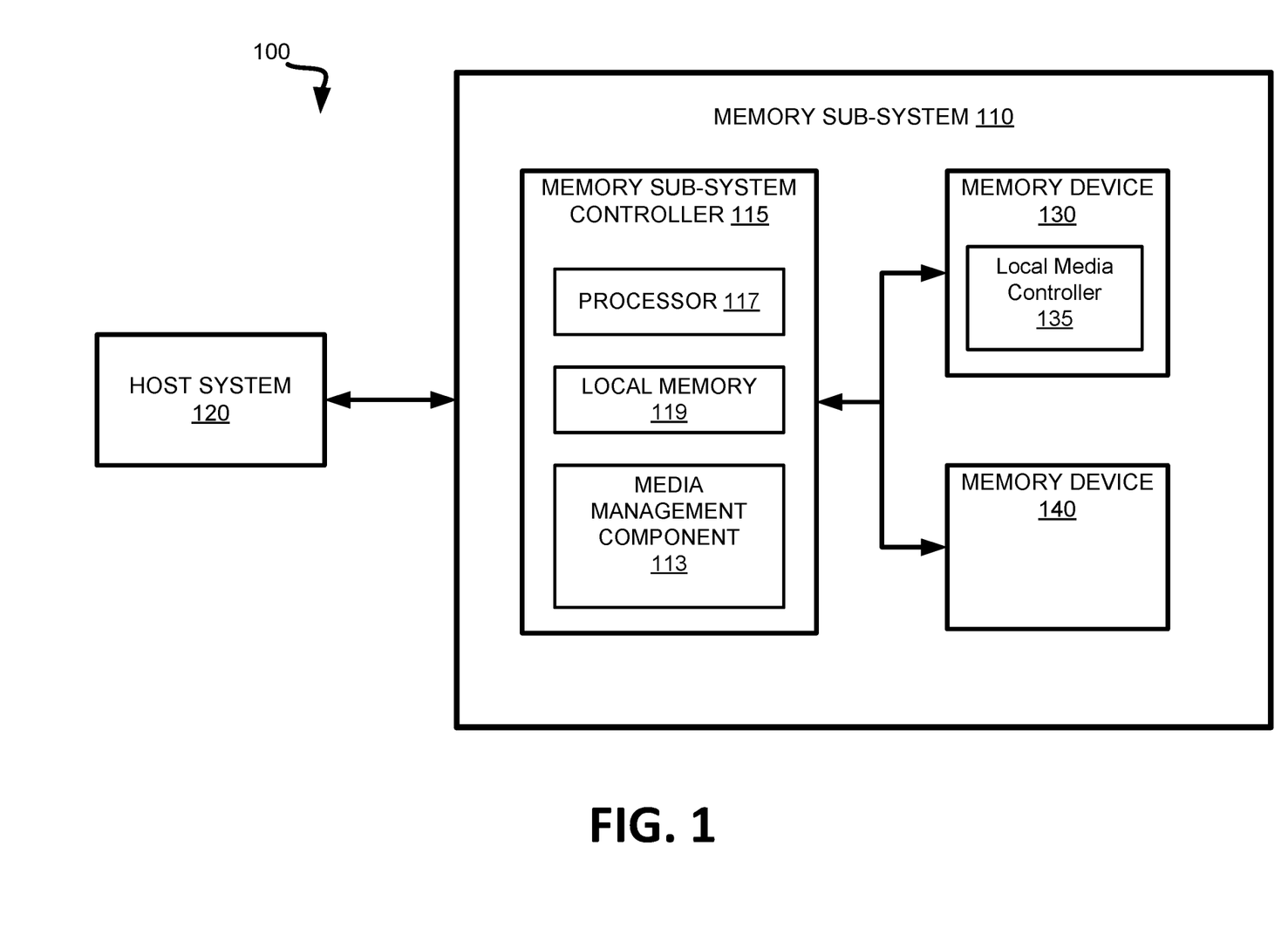
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell.

In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g. 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local controller 132) on the die and a controller (e.g., memory sub-system controller 115) for media management within the same memory device package. An example of a managed memory device is a managed NAND (MNAND) device.

In one embodiment, the memory sub-system 110 includes a media management component 113 that can be used to manage data in the memory device 130 and the memory device 140. In some embodiments, the memory sub-system controller 115 includes at least a portion of the media management component 113. In some embodiments, the media management component 113 is part of the host system 120, an application, or an operating system. In other embodiments, local media controller 135 includes at least a portion of media management component 113 and is configured to perform the functionality described herein. The media management component 113 can communicate directly with the memory devices 130 and 140 via a synchronous interface. Furthermore, transfers of data between the memory device 130 and the memory device 140 can be done within the memory sub-system 110 without accessing the host system 120.

The media management component 113 can perform data integrity checks on a wordline of a block responsive to performing a write operation on an adjacent wordline. The write operation can identify a wordline that addresses the set of memory cells onto which the data should be programmed. The data integrity check can be used to determine, based on a data state metric, whether a write operation programing data to the identified set of memory cells unintentionally programmed any random data to a set of memory cells associated with a subsequent wordline (e.g., due to wordline-to-wordline short). The data state metric is a quantity that is measured or inferred from the state of data stored on a memory device. Specifically, the data state metric may reflect the state of the bits on a wordline. In an example, the data state metric is a function of a bit count (which corresponds to the number of bits programmed the memory cells of a wordline), a stored program voltage on the memory cells of a wordline, or any combination thereof. The media management component 113 can identify or indicate a read operation to be used by memory device 130 and/or memory device 140 to retrieve the bit count (or voltage value) that is stored on a data structure (e.g., a metadata table) of memory device 130, 140. For example, the media management component 113 can provide a read operation to provide a read reference voltage at a particular wordline and one or more particular bitlines to retrieve data stored at the particular wordline of the memory device 130, 140. As a result, data can be retrieved from the wordline of the memory device 130, 140. The media management component 113 can then perform a bit count operation to determine the number of bits stored by the wordline.

In an illustrative example, responsive to performing a write operation on a wordline of a block, the media management component 113 can trigger a data integrity check on a subsequent wordline. Each data integrity check can identify a data state metric value (e.g., a bit count) for the subsequent wordline of the block. In some embodiments, the data integrity check can include reading data from all or a set of sampled memory cells in the wordline. The set of sampled memory cells can be selected at random (e.g., a predetermined number of random memory cells), or can be from predetermined locations (e.g., all of the odd memory cells, every third memory cell, etc.). Upon reading the data from memory cells of the subsequent wordline, a bit count operation can be performed on the read data. In some embodiments, the bit count operation can determine the count of bits (or memory cells) programmed to a specified logical state in a wordline (e.g., number of "1" bits programmed to the memory cells of the wordline when an erased wordline contains only "0" bits, or vice-versa). During the bit count operation, one or more data state metrics, such as a write data count, can be determined for the data read from the set of sampled memory cells.

In some embodiments, a data state metric value exceeding a transfer threshold criterion can trigger a media management operation (e.g., a folding operation). A transfer threshold criterion can be a predetermined threshold value that is set during manufacturing of the memory sub-system 110, and/or can be modified by input received by the media management component 113. In some embodiments, the folding operation involves copying, by the media management component 113, data from a block to an available physical location on the memory device 130, such as one or more available blocks on the memory device 130. This available physical location can be selected as, for example, a physical location having a lowest write count, a physical location having been least recently accessed, etc. A list of available physical locations can be maintained in a free pool stored in local memory 119. Upon copying the data, media management component 113 records a mapping of a logical address associated with the data from the block to the available physical addresses in a look-up table. In one embodiment, the look-up table is maintained in local memory 119 of memory sub-system controller 115. Thus, when the memory sub-system controller 115 applies the logical address to the look-up table, the corresponding physical address is output. In other embodiments, the mapping can be maintained in some other type of data structure, such as an array, linked list, etc.

Additionally, the media management component 113 can retire the block from which the data was transferred. A retired data block is a block that is no longer used to store data by the memory sub-system controller 113. If a data integrity check yields no data state metric values exceeding the transfer threshold criterion, the media management component 113 can program to the subsequent wordline during a future write operations. Further details with regards to the operations of the media management component 113 are described below.

Figure 2:
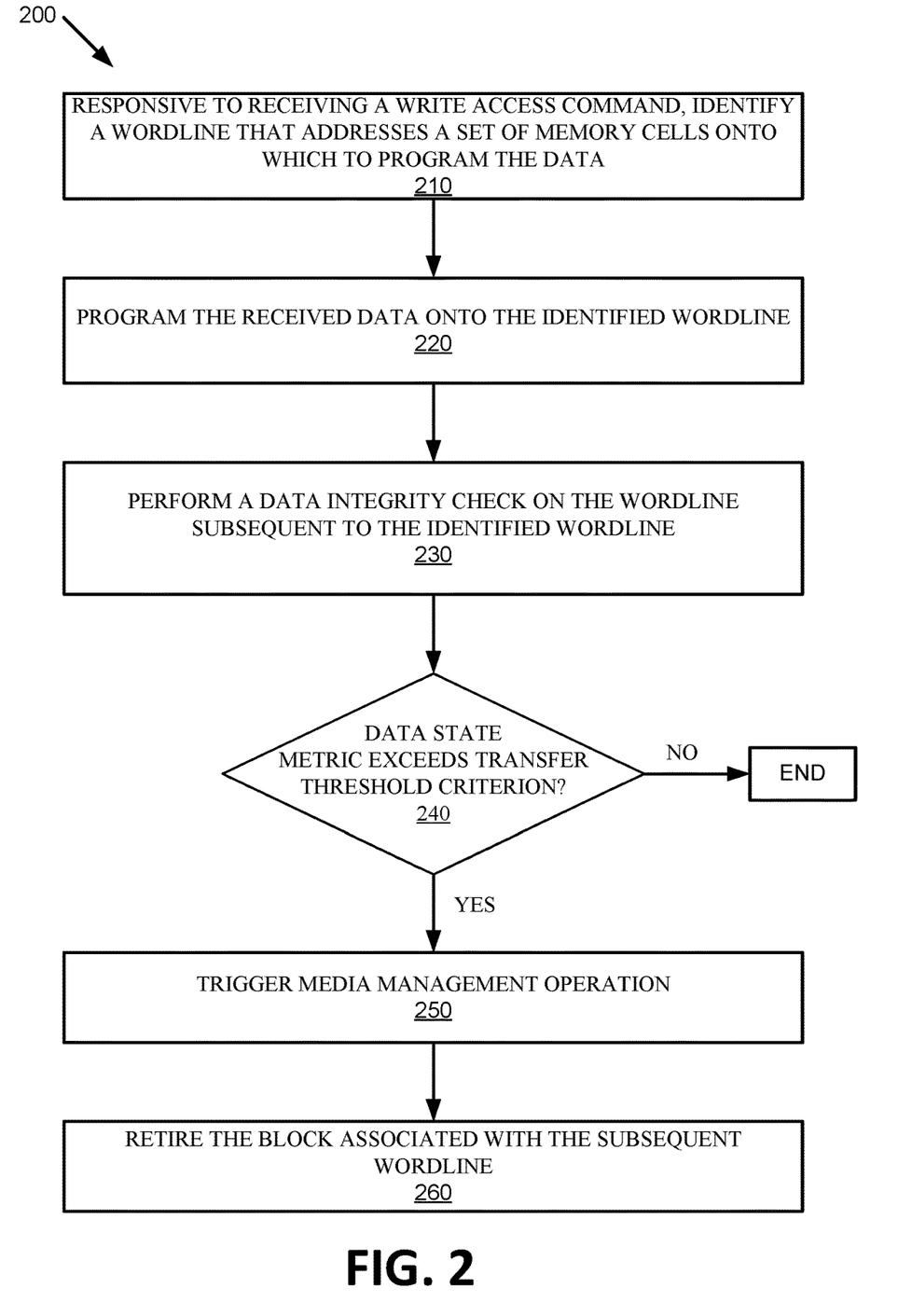
FIG. 2 is a flow diagram of an example method for performing data integrity checks, in accordance with some embodiments of the present disclosure.

FIG. 2 is a flow diagram of an example method 200 for performing data integrity checks, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the media management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, responsive to receiving a write command, the processing logic identifies a wordline that addresses a set of memory cells (e.g., a page) onto which to program the data. In some embodiments, the identified wordline can be the first wordline in an empty block. In other embodiments, the identified wordline can be a next available wordline in a block in which one or more wordlines contain data. The write command can be initiated by a host (e.g., host 120) or by a memory sub-system controller (e.g., memory sub-system controller 113).

At operation 220, the processing logic programs the received data to the identified set of memory cells. For example, the data may be retrieved from a memory device or a cache and programmed onto the memory cells. To program the data, the processing logic can apply a certain voltage to each memory cell, which results in an electric charge being held by each memory cell, thus determining a voltage signal $V_{CG}$ that has to be applied to a control electrode of the cell to open the cell to the flow of electric current across the cell, between the source electrode and the drain electrode.

At operation 230, the processing logic performs a data integrity check on the wordline subsequent to the identified wordline. A subsequent wordline is an adjacent wordline that is the sequentially next wordline in a block. For example, in a block with ten wordlines, if the processing logic programs the received data to the first wordline of the block, then the subsequent wordline is the second wordline of the block. Similarly, if the processing logic programs the received data to the fifth wordline of the block, then the subsequent wordline is the sixth wordline of the block. By starting at the first wordline of each block and progressing to the next subsequent wordline for each subsequent program operation, the processing logic can perform method 200 for each set of adjacent wordlines.

The data integrity check can include identifying a data state metric value for the subsequent wordline of the block by performing a read operation. In some embodiments, the data state metric value includes a bit count of the subsequent wordline. For example, the processing logic can perform a read operation on all or a set of memory cells in the subsequent wordline. Upon reading the data from memory cells of the subsequent wordline, the processing logic can perform a bit count operation on the read data to determine the count of bits (or memory cells) programmed to a specified logical state in the wordline in the wordline (e.g., number of "0" bits programmed to the memory cells of the wordline when an erased wordline contains only "1" bits, or vice-versa).

At operation 240, the processing logic determines whether the data state metric value exceeds a transfer threshold criterion. In some embodiments, the transfer threshold criterion can be a predetermined value of bits in specified logical state (e.g., 0 bits in the specified logical state, 1 bit in the specified logical state, 2 bits in the specified logical state, and so forth). The transfer threshold criterion can be a predetermined threshold value that is set during manufacturing of the memory sub-system, and/or modified by input received by the media management component. Responsive to the processing logic determining that the data state metric value (e.g., the bit count value) does not exceed the transfer threshold criterion (e.g., bit count operation determines that 0 bits are set in the subsequent wordline, which does not exceed the transfer threshold criterion value of 0), the processing logic ends method 200. Accordingly, the processing logic can program data to the subsequent wordline during a future write access operation.

Responsive to the processing logic determining that the data state metric value does not exceed the transfer threshold criterion (e.g., bit count operation determines that 20 bits are set in the subsequent wordline, which exceeds the transfer threshold criterion value of 0), the processing logic proceeds to operation 250, and triggers a media management operation (e.g., a folding operation). For example, the media management operation can write the data stored at the entire block to an available block of the memory sub-system. In some embodiments, the processing logic can perform the media management operation on all the wordlines storing data except for the identified wordline. This is because the write access operation could have failed to correctly program the received data due to the leak from the wordline-to-wordline short between the identified wordline and the subsequent wordline. Accordingly, the data can be retrieved, again, from the memory device or the cache and programmed to a wordline of a different block.

At operation 250, the processing logic can retire the block associated with the subsequent wordline. The retired data block will no longer used to store data by the processing logic. In some embodiments, the processing logic can mark the block as retired in a look-up table, a data structure, etc.

Figure 3:
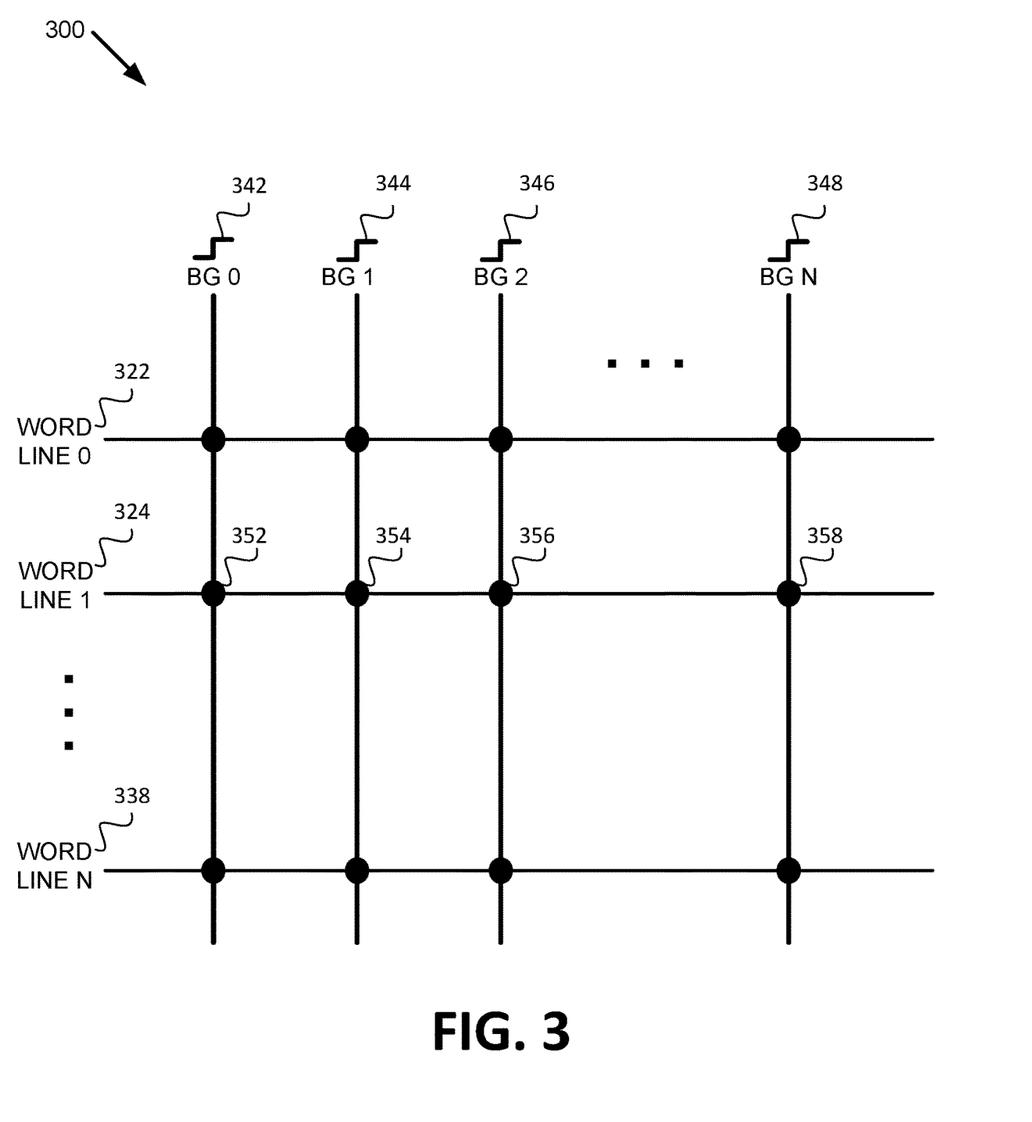
FIG. 3 is an architecture of wordlines and bit lines of a block, in accordance with some embodiments of the present disclosure.

FIG. 3 illustrates an example of wordlines and bitlines of a block 300, in accordance with some embodiments of the present disclosure. Memory cells in the same row form a wordline (e.g., wordline 0 (322), wordline 1 (324), wordline N (338)) and the transistors of memory cells in the same column (each memory cell from a different memory page) are bound together to form a bitline (e.g., bitline group (BG) 0 (342), bitline group 1 (344), bit line group 2 (346), and bit line group N (348)). The intersection of a wordline and a bitline may correspond to a memory cell or a memory page at a corresponding physical block address. For example, memory cells 352, 354, 356, 358 form wordline 1 (324).

Only one memory cell is read at a time per bitline. During a read operation, a read reference voltage is applied to the wordline containing the data to be read, while a pass-through voltage is applied to wordlines of unread memory cells. The pass through voltage is a read reference voltage higher than any of the stored threshold voltages.

After a write operation programs data onto the memory cells (not shown) of wordline 0 (322), the media management component 113 can perform a data integrity check on wordline 1 (324), which is subsequent to wordline 0 (322). For example, media management component 113 can perform a read access operation on all or a set of memory cells in wordline 1 (324). Upon reading the data from memory cells of wordline 1 (324), the media management component 113 can perform a bit count operation on the read data to determine the count of bits (or memory cells) programmed to a specified logical state in wordline 1 (324). Responsive to the number of bits programmed to a specified logical exceeding a transfer threshold criterion, the media management component 113 can perform a media management operation to copy the data of the block 300 to another block. The media management component 113 can then retire block 300. Responsive to the number of bits programmed to a specified logical set failing to exceed the transfer threshold criterion, the media management component 113 can program data to wordline 324 during a future write operation. Responsive to programming data to wordline 324, the media management component 113 can then perform a data integrity check on the next wordline of block 300 (e.g., wordline 2, which is not shown).

Figure 4:
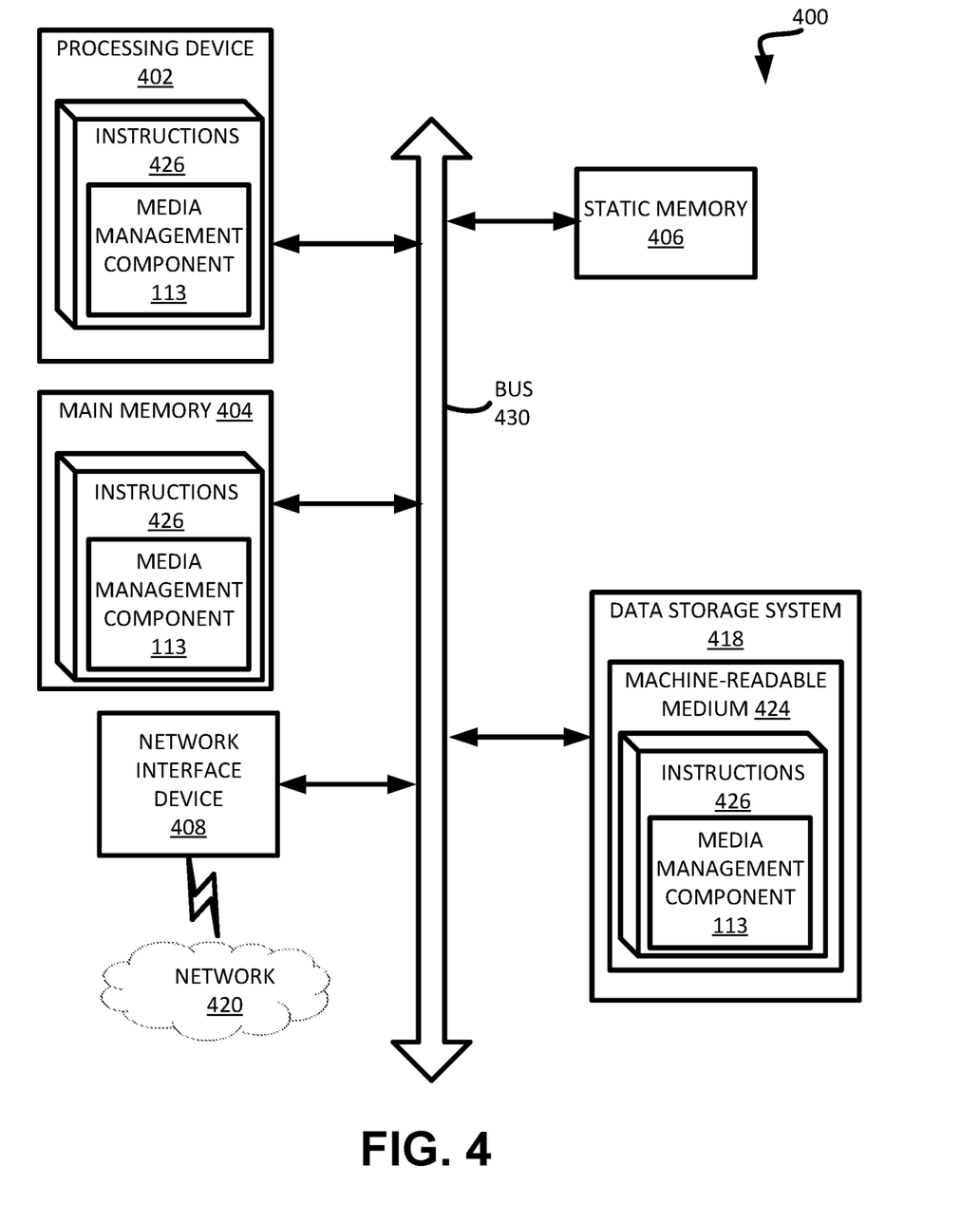
FIG. 4 is a block diagram of an example computer system in which embodiments of the present disclosure can operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes or utilizes a memory sub-system (e.g., the memory sub-system 110 of FIG. 1) or can be used to perform the operations of a controller (e.g., to execute an operating system to perform operations corresponding to media management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430. Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to media management component 113 of FIG. 1. While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
  a memory device; and
  a processing device, operatively coupled to the memory device, to perform operations comprising:
    performing a write operation to program first data to a first set of memory cells addressable by a first wordline of a first plurality of wordlines of a first block of the memory device;
    performing a read operation on a second wordline of the plurality of wordlines, wherein the second wordline is a sequentially next and unwritten to wordline in the first block and is adjacent to the first wordline;
    determining a number of bits programmed in a first logical level in the second wordline; and
    responsive to determining that the number of bits programmed in the first logical level satisfies a threshold criterion, copying second data from the first block to a second block.

2. The system of claim 1, wherein the processing device to perform further operations comprising:
  retiring the first block from further use by the memory device.

3. The system of claim 1, wherein the processing device to perform further operations comprising:
  performing another write operation to program the first data to a third block.

4. The system of claim 1, wherein the first set of memory cells comprises each memory cell associated with the first wordline.

5. The system of claim 1, wherein the first set of memory cells comprises a predetermined subset of memory cells associated with the first wordline.

6. The system of claim 1, wherein the processing device to perform further operations comprising:
  responsive to the number of bits set failing to satisfy the threshold criterion, performing a write operation on the second wordline to program third data.

7. The system of claim 1, wherein the processing device to perform further operations comprising:
  determining a count of memory cells programmed in a second logical level in the second wordline.

8. A method, comprising:
  performing, by a processor, a write operation to program first data to a first set of memory cells addressable by a first wordline of a first plurality of wordlines of a first block of a memory device;
  performing a read operation on a second wordline of the plurality of wordlines, wherein the second wordline is a sequentially next and unwritten to wordline in the first block and is adjacent to the first wordline;
  determining a number of bits programmed in a first logical level in the second wordline; and
  responsive to determining that the number of bits programmed in the first logical level satisfies a threshold criterion, copying second data from the first block to a second block.

9. The method of claim 8, further comprising:
  retiring the first block from further use by the memory device.

10. The method of claim 8, further comprising:
  performing another write operation to program the first data to a third block.

11. The method of claim 8, wherein the first set of memory cells comprises each memory cell associated with the first wordline.

12. The method of claim 8, wherein the first set of memory cells comprises a predetermined subset of memory cells associated with the first wordline.

13. The method of claim 8, wherein the threshold criterion comprises a threshold value of set bits.

14. The method of claim 8, further comprising:
  determining a count of memory cells programmed in a second logical level in the second wordline.

15. A non-transitory computer-readable storage medium comprising instructions that, when executed by a processing device operatively coupled to a memory, performs operations comprising:
  performing a write operation to program first data to a first set of memory cells addressable by a first wordline of a first plurality of wordlines of a first block of a memory device;

performing a read operation on a second wordline of the plurality of wordlines, wherein the second wordline is a sequentially next and unwritten to wordline in the first block and is adjacent to the first wordline;

determining a number of bits programmed in a first logical level in the second wordline; and responsive to determining that the number of bits programmed in the first logical level satisfies a threshold criterion, copying second data from the first block to a second block.

16. The non-transitory computer-readable storage medium of claim 15, wherein the processing device to perform further operations comprising:

retiring the first block from further use by the memory device.

17. The non-transitory computer-readable storage medium of claim 15, wherein the processing device to perform further operations comprising:

performing another write operation to program the first data to a third block.

18. The non-transitory computer-readable storage medium of claim 15, wherein the first set of memory cells comprises each memory cell associated with the first wordline.

19. The non-transitory computer-readable storage medium of claim 15, wherein the first set of memory cells comprises a predetermined subset of memory cells associated with the first wordline.

20. The non-transitory computer-readable storage medium of claim 15, wherein the processing device to perform further operations comprising:

responsive to the number of bits set failing to satisfy the threshold criterion, performing a write operation on the second wordline to program third data.

* * * * *